United States Patent
Ichiki et al.

(10) Patent No.: US 6,861,643 B2
(45) Date of Patent: Mar. 1, 2005

(54) NEUTRAL PARTICLE BEAM PROCESSING APPARATUS

(75) Inventors: Katsunori Ichiki, Kanagawa (JP); Kazuo Yamauchi, Kanagawa (JP); Hirokuni Hiyama, Kanagawa (JP); Seiji Samukawa, Miyagi (JP)

(73) Assignee: Ebara Corporation, Ohta-ku (JP)

( * ) Notice: Subject to any disclaimer, the term of this patent is extended or adjusted under 35 U.S.C. 154(b) by 0 days.

(21) Appl. No.: 10/471,741

(22) PCT Filed: Mar. 22, 2002

(86) PCT No.: PCT/JP02/02752

§ 371 (c)(1),
(2), (4) Date: Sep. 24, 2003

(87) PCT Pub. No.: WO02/078042

PCT Pub. Date: Oct. 3, 2002

(65) Prior Publication Data

US 2004/0108470 A1 Jun. 10, 2004

(30) Foreign Application Priority Data

Mar. 26, 2001 (JP) ........................................ 2001-088898

(51) Int. Cl.⁷ ............................ H01L 21/306; H05H 3/00
(52) U.S. Cl. ................. 250/251; 250/423 R; 313/359.1; 313/362.1; 313/363.1; 315/111.21; 315/111.31; 156/345.39
(58) Field of Search .............................. 250/251, 423 R; 313/359.1, 362.1, 363.1; 315/111.21, 111.31; 156/345.39

(56) References Cited

U.S. PATENT DOCUMENTS

| | | | |
|---|---|---|---|
| 5,279,669 A | | 1/1994 | Lee |
| 5,518,572 A | * | 5/1996 | Kinoshita et al. ...... 156/345.34 |
| 5,818,040 A | * | 10/1998 | Kinoshita et al. ........... 250/251 |
| 5,998,097 A | | 12/1999 | Hatakeyama et al. |
| 2004/0070348 A1 | * | 4/2004 | Ichiki et al. ............ 315/111.21 |
| 2004/0074604 A1 | * | 4/2004 | Ichiki et al. ........... 156/345.39 |

FOREIGN PATENT DOCUMENTS

| | | |
|---|---|---|
| EP | 0 663 671 | 7/1995 |
| EP | 0 790 757 | 8/1997 |
| EP | 1 160 826 | 12/2001 |
| WO | WO 01/06534 | 1/2001 |

OTHER PUBLICATIONS

European Patent Office, Patent Abstracts of Japan, Publication No. 2000100790, dated Apr. 7, 2000. Cited in the int'l. search report.

European Patent Office, Patent Abstracts of Japan, Publication No. 2000100798, dated Apr. 7, 2000. Cited in the int'l. search report.

* cited by examiner

Primary Examiner—Nikita Wells
(74) Attorney, Agent, or Firm—Westerman, Hattori, Daniels & Adrian, LLP

(57) ABSTRACT

A neutral particle beam processing apparatus comprises a process gas inlet port (11) for introducing a process gas into a vacuum chamber (1), a plasma generating chamber (2) for generating positive ions and electrons from the introduced process gas, and a negative ion generating chamber (3) for attaching electrons generated in the plasma generating chamber to the residual gas to generate negative ions. The neutral particle beam processing apparatus further comprises an ion extracting portion (4) for extracting the positive ions or the negative ions and accelerating the positive ions or the negative ions in a predetermined direction, and a neutralizing chamber (5) for neutralizing an ion beam generated by the ion extracting portion (4) to generate a neutral particle beam. The neutral particle beam generated in the neutralizing chamber (5) is applied to a workpiece (X).

17 Claims, 2 Drawing Sheets

FIG. 3
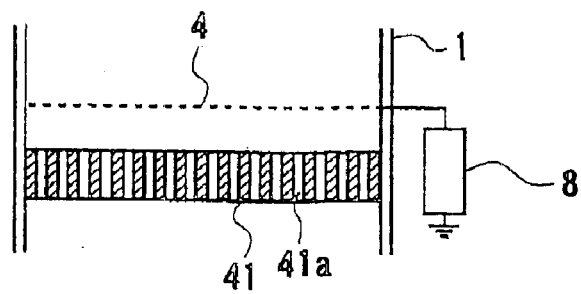
FIG. 4A   FIG. 4B   FIG. 4C
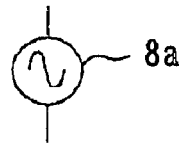 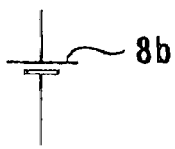 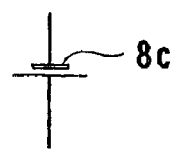
FIG. 5A   FIG. 5B
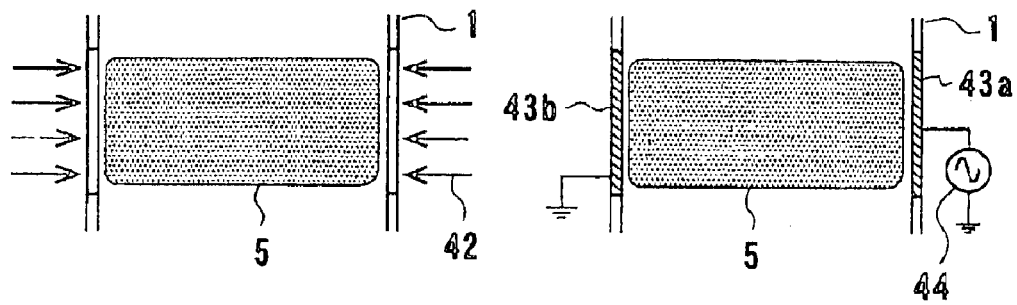
FIG. 5C   FIG. 5D
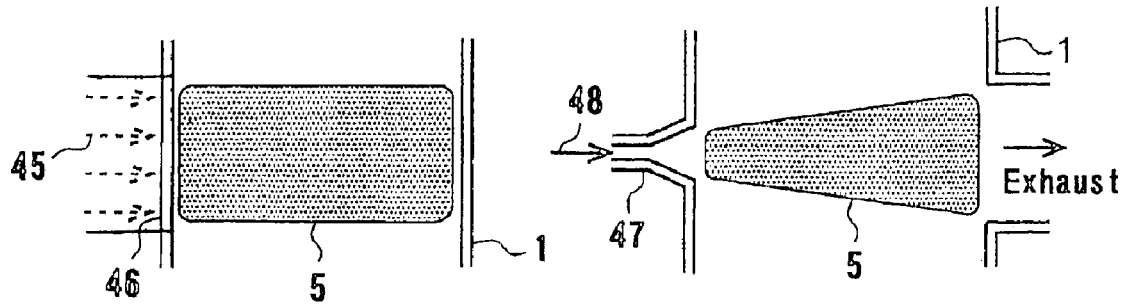

NEUTRAL PARTICLE BEAM PROCESSING APPARATUS

TECHNICAL FIELD

The present invention relates to a neutral particle beam processing apparatus, and more particularly to a neutral particle beam processing apparatus for generating a highly directional and highly dense neutral particle beam from a high-density plasma and processing a workpiece with the generated neutral particle beam.

BACKGROUND ART

In recent years, semiconductor integrated circuits, information storage media such as hard disks, micromachines, and the like have been processed in highly fine patterns. In the fields of processing such workpieces, attention has been attracted to the use of an energetic beam such as a high-density neutral particle beam or a high-density ion beam which is highly linear, i.e., highly directional, and has a relatively large beam diameter. For example, the energetic beam is applied to a workpiece for depositing a film thereon or etching the workpiece.

As beam sources of such energetic beams, there have been used beam generators which generate various kinds of beams including a positive ion beam, a negative ion beam, a neutral particle beam, and a radical beam. The positive ion beam, the negative ion beam, the neutral particle beam, or the radical beam is applied to a desired area of a workpiece from the beam source, for thereby locally depositing a film on the workpiece, etching the workpiece, modifying the surface of the workpiece, or joining or bonding parts of the workpiece.

When charged particles are applied to a workpiece such as an extremely thin silicon oxide film for semiconductor integrated circuits, a dielectric breakdown may be caused on the workpiece. However, a neutral particle beam having no electric charges but having a large translational energy is unlikely to damage a workpiece. Therefore, it has been expected to apply such a neutral particle beam to fine processes.

As a beam source of such a neutral particle beam, there has been known a beam generator which generates a negative ion beam from a plasma and detaches electrons from the negative ion beam by electron impact for thereby neutralizing the negative ion beam. This neutral particle beam generator comprises a neutralizing chamber having a filament therein. Thermoelectrons produced by the filament are trapped in the neutralizing chamber to generate an electron cloud having a high energy. The negative ion beam which has been focused with an electrostatic lens is introduced into the neutralizing chamber and neutralized by detaching electrons while passing through the electron cloud in the neutralizing chamber.

In the case where the negative ions are neutralized by electron impact, it is required to generate a high-density electron cloud in order to obtain a high neutralization efficiency. However, since a high-density electron cloud is generated only in an extremely small space, the beam diameter of the neutral particle beam cannot be made larger.

There has been known another neutral particle beam generator which irradiates photons to a negative ion beam to detach electrons therein for thereby neutralizing the negative ion beam. In this neutral particle beam generator, since a photon energy is larger than an electron detachment energy from the negative ion beam, a high neutralization efficiency can be obtained without dependence upon the energy of the negative ion beam.

In the case where the negative ions are neutralized by application of photons, a large light source and a large optical system are required to make the beam diameter of the neutral particle beam larger, resulting in a larger size of the apparatus. Only a slight part of light emitted from the light source contributes to neutralization, and the rest of light becomes heat loss. In order to obtain a high neutralization efficiency, the light source is required to have a higher fluence. However, the light source having a higher fluence needs a cooling mechanism or the like, resulting in a larger size of apparatus and a higher cost of the equipments.

If a radiation (e.g., an ultraviolet ray) produced by the plasma in the neutral particle beam source is applied to the workpiece, then the radiation adversely affects the workpiece. Thus, it is necessary to shield the workpiece from an adverse radiation (e.g., an ultraviolet ray) emitted from the plasma source.

DISCLOSURE OF INVENTION

The present invention has been made in view of the above drawbacks. It is therefore an object of the present invention to provide a neutral particle beam processing apparatus which can apply an energetic beam having a large beam diameter to a workpiece with an inexpensive and compact structure, and can highly accurately perform a process such as an etching process or a deposition process on the workpiece without a damage.

According to an aspect of the present invention, there is provided a neutral particle beam processing apparatus, comprising: a process gas inlet port for introducing a process gas into a vacuum chamber; a plasma generating chamber for generating positive ions and electrons from the introduced process gas; a negative ion generating chamber for attaching the electrons generated in the plasma generating chamber to the residual gas to generate negative ions; an ion extracting portion for extracting the positive ions or the negative ions and accelerating the positive ions or the negative ions in a predetermined direction; and a neutralization device for neutralizing an ion beam generated by the ion extracting portion to generate a neutral particle beam, the neutral particle beam being applied to a workpiece.

With the above arrangement, a plasma composed of a large quantity of positive ions and electrons is generated in the plasma generating chamber. In the negative ion generating chamber disposed downstream of the plasma generating chamber, the electrons which have lost energy by collision while being delivered through the negative ion generating chamber and have a lowered electron temperature are attached to the residual gas, for thereby generating a large quantity of negative ions. Thus, negative ions can be generated with a simple structure. The ions are extracted by the ion extracting portion and neutralized by the neutralization device, and hence a neutral particle beam can easily be generated. With a processing apparatus using such a neutral particle beam, various processes including an etching process and a deposition process can be performed on the workpiece with high accuracy in such a state that an amount of charge build-up is reduced.

According to a preferred aspect of the present invention, the neutral particle beam processing apparatus further comprises an electron cloud generator provided in the negative ion generating chamber for lowering the probability that the electrons collide with a sidewall surface of the negative ion generating chamber and are inactivated and for increasing the probability that the electrons attach to the residual gas.

With the above arrangement, a high-density negative ions can be generated with increased efficiency. Further, a high-density neutral particle beam can be generated by neutralizing such high-density negative ions.

According to a preferred aspect of the present invention, the ion extracting portion comprises a grid electrode and a power supply for biasing the grid electrode to a positive or negative potential. With this arrangement, the negative ions generated in the negative ion generating chamber or the positive ions generated in the plasma generating chamber can easily be extracted from the negative ion generating chamber and neutralized to generate a neutral particle beam.

The neutralization device may comprise a light source for applying a light ray to the ion beam, or may comprise an electrode and a power supply for applying a high-frequency electric field through the electrode to the ion beam. The neutralization device may comprise an electron beam radiation device for radiating an electron beam to the ion beam, or may comprise an electron cloud generator for generating an electron cloud along a path of the ion beam. Alternatively, the neutralization device may form a region where the pressure of gas molecules is high within a path of the ion beam. The neutralization device may comprise an orifice plate having orifices for allowing the ion beam to pass therethrough.

According to the present invention, from a plasma having a large beam diameter, it is possible to generate a neutral particle beam having the same diameter as the plasma without complicated mechanisms for generating negative ions, and to apply such a neutral particle beam to the workpiece.

The above and other objects, features, and advantages of the present invention will be apparent from the following description when taken in conjunction with the accompanying drawings which illustrates preferred embodiments of the present invention by way of example.

BRIEF DESCRIPTION OF DRAWINGS

FIG. 2A is an axial cross-sectional view, and FIG. 2B is a radial cross-sectional view;

FIG. 3 is a fragmentary view showing an example of an ion extracting portion and a neutralizing device;

FIGS. 4A through 4C are schematic views showing various power supplies connected to the ion extracting portion; and FIGS. 5A through 5D are schematic fragmentary views showing various examples of the neutralization device.

BEST MODE FOR CARRYING OUT THE INVENTION

A neutral particle beam processing apparatus according to an embodiment of the present invention will be described in detail below with reference to FIGS. 1 through 5D.

Figure 1:
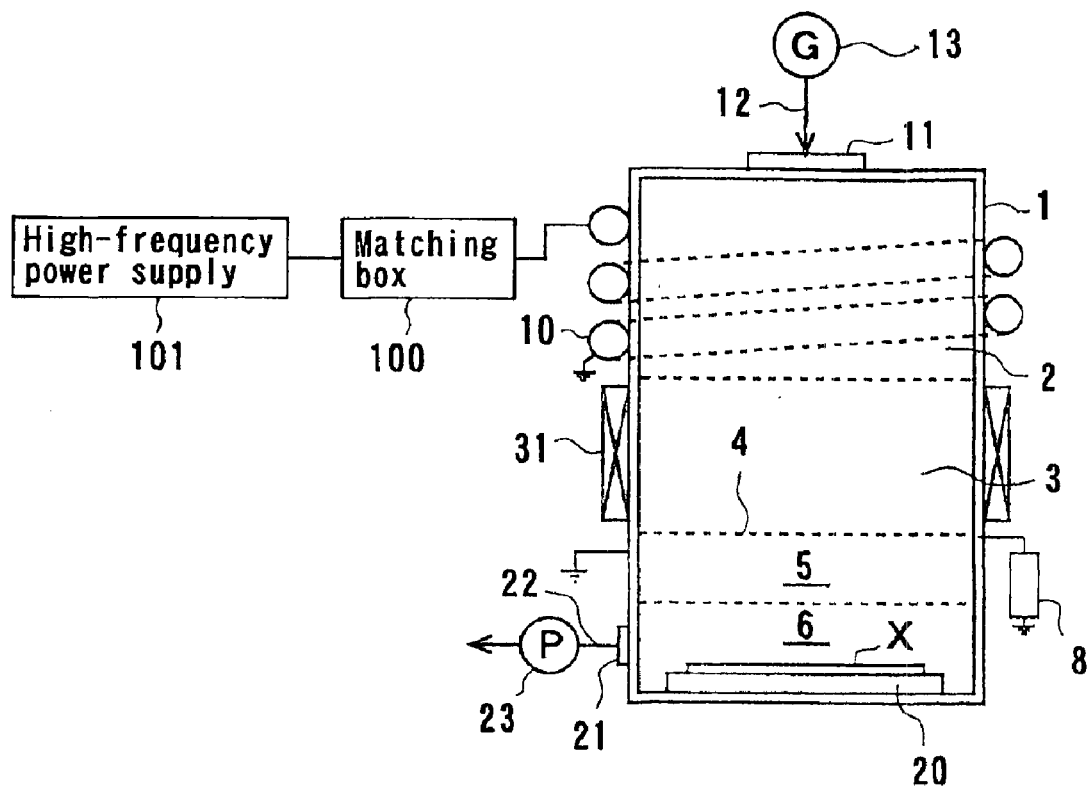
FIG. 1 is a schematic view showing a whole arrangement of a neutral particle beam processing apparatus according to an embodiment of the present invention.

FIG. 1 is a schematic view showing a whole arrangement of a processing apparatus according to a first embodiment of the present invention, with electric components in block form. As shown in FIG. 1, the processing apparatus comprises a cylindrical vacuum chamber 1 having a process gas inlet port 11 for introducing a process gas into the vacuum chamber 1. The vacuum chamber 1 has a plasma generating chamber 2 defined therein for generating positive ions and electrons from the introduced process gas, a negative ion generating chamber 3 disposed downstream of the plasma generating chamber 2 for attaching electrons generated in the plasma generating chamber 2 to the residual process gas to generate negative ions, and an ion extracting portion 4 for extracting the generated positive or negative ions and accelerating the generated positive or negative ions in a predetermined direction.

The vacuum chamber 1 also has a neutralizing chamber 5 defined therein for neutralizing the extracted positive or negative ions, and a process chamber 6 defined therein for processing a workpiece X such as a semiconductor substrate, a glass workpiece, an organic workpiece, a ceramic workpiece, or the like. The ions that have been extracted and accelerated by the ion extracting portion 4 are neutralized in the neutralizing chamber 5 and converted into neutral particles. The neutral particles are applied to the workpiece X in the process chamber 6. The vacuum chamber 1 has walls made of quartz glass, ceramics, or the like.

The plasma generating chamber 2 has a coil 10 disposed therearound for inductively coupled plasma (ICP). The coil 10 is housed in a water-cooled tube having an outside diameter of 8 mm, for example. The coil 10 of about two turns is wound around the plasma generating chamber 2. The coil 10 is electrically connected through a matching box 100 to a high-frequency power supply 101, which applies a high-frequency voltage having a frequency of about 13.56 MHz, for example, to the coil 10. When a high-frequency current is supplied from the high-frequency power supply 101 via the matching box 100 to the coil 10, an induced magnetic field is produced in the plasma generating chamber 2 by the coil 10. The varying magnetic field induces an electric field. The electric field accelerates electrons, which ionizes atoms and molecules in the process gas to generate a plasma in the plasma generating chamber 2. Thus, the coil 10, the matching box 100, and the high-frequency power supply 101 constitute a plasma generator for generating a plasma from the process gas in the plasma generating chamber 2. The generated plasma is mainly composed of positive ions and heated electrons which coexist therein.

The gas inlet port 11 defined in an upper portion of the plasma generating chamber 2 is connected through a gas supply pipe 12 to a gas supply source 13, which supplies a gas such as $SF_6$, $CHF_3$, $CF_4$, $Cl_2$, Ar, $O_2$, $N_2$, and $C_4F_8$ to the plasma generating chamber 2.

The process chamber 6 houses a workpiece holder 20 therein for holding the workpiece X. The workpiece X is placed on an upper surface of the workpiece holder 20. The process chamber 6 has a gas outlet port 21 defined in a sidewall thereof for discharging the gas from the process chamber 6. The gas outlet port 21 is connected through a gas outlet pipe 22 to a vacuum pump 23, which operates to maintain the plasma generating chamber 2, the negative ion generating chamber 3, the neutralizing chamber 5, and the process chamber 6 at a predetermined pressure.

In the negative ion generating chamber 3, electrons generated in the plasma generating chamber 2 are attached to the residual gas to generate a large quantity of negative ions. The plasma generating chamber 2 and the negative ion generating chamber 3 are integrally combined contiguously with each other, and the negative ion generating chamber 3 is disposed downstream of the plasma generating chamber 2.

The process gas is continuously supplied into the plasma generating chamber 2 from the upstream end of the plasma generating chamber 2, for thereby continuously generating a plasma which is mainly composed of positive ions and electrons. The generated plasma is continuously delivered into the negative ion generating chamber 3 disposed downstream of the plasma generating chamber 2. In the negative ion generating chamber 3, electrons which have lost energy by collision while being delivered through the negative ion generating chamber 3 and have a lowered electron temperature are attached to molecules or atoms of the residual gas, for thereby generating a large quantity of negative ions. Therefore, a plasma comprising a mixture of positive ions generated in the plasma generating chamber 2, negative ions generated in the negative ion generating chamber 3, and electrons is generated in the negative ion generating chamber 3.

Figure 2A:
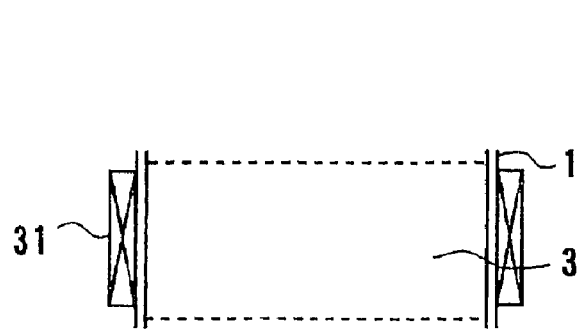
FIGS. 2A and 2B are cross-sectional views showing an example of an electron cloud generator.
Figure 2B:
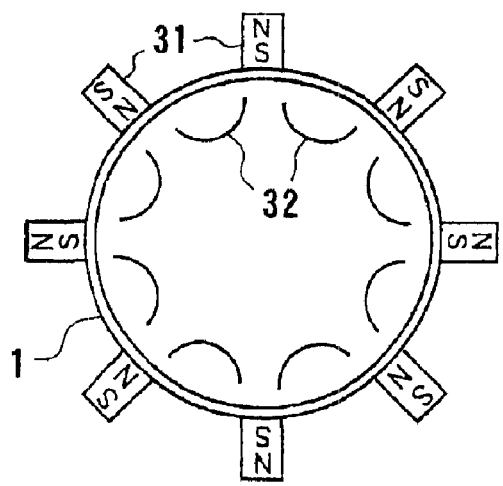

The negative ion generating chamber 3 should preferably comprise an electron cloud generator for lowering the probability that electrons collide with the sidewall surfaces of the negative ion generating chamber 3 and are inactivated and for increasing the probability that electrons are attached to the residual gas. FIGS. 2A and 2B show an example of an electron cloud generator. FIG. 2A is an axial cross-sectional view, and FIG. 2B is a radial cross-sectional view. As shown in FIGS. 2A and 2B, permanent magnets 31 are disposed around the negative ion generating chamber 3 at predetermined circumferential intervals. The permanent magnets 31 are arranged so that the magnetic poles of the adjacent permanent magnets are opposed to each other. With this arrangement, the permanent magnets 31 produce a magnetic field in the negative ion generating chamber 3 as illustrated by lines 32 of magnetic force in FIG. 2B. Since electrons in the plasma move along the lines 32 of magnetic force, the electrons are prevented from contacting the inner sidewall surface of the negative ion generating chamber 3. Thus, an electron cloud is formed at positions away from the inner sidewall surface of the negative ion generating chamber 3. This electron cloud lowers the probability that electrons collide with the inner sidewall surface of the negative ion generating chamber 3 and are inactivated, for thereby efficiently generating negative ions in the negative ion generating chamber 3.

The ion extracting portion 4 for extracting positive or negative ions and accelerating the positive or negative ions in a predetermined direction is provided downstream of the negative ion generating chamber 3. The ion extracting portion 4 is constituted by a grid electrode 4, for example. The grid electrode 4 is connected to a power supply 8, which applies a positive or negative bias voltage to the grid electrode 4.

FIG. 3 is a fragmentary view showing an example of the ion extracting portion 4, and FIGS. 4A through 4C show various power supplies connected to the grid electrode 4. When an AC voltage is applied to the grid electrode 4 by the power supply 8a shown in FIG. 4A, positive ions and negative ions are alternately extracted from the negative ion generating chamber 3 and accelerated toward the downstream neutralizing chamber 5. When a positive DC voltage is applied to the grid electrode 4 by the power supply 8b shown in FIG. 4B, positive ions are extracted from the negative ion generating chamber 3 and accelerated toward the downstream neutralizing chamber 5. When a negative DC voltage is applied to the grid electrode 4 by the power supply 8c shown in FIG. 4C, negative ions are extracted from the negative ion generating chamber 3 and accelerated toward the downstream neutralizing chamber 5.

In the example shown in FIG. 3, an orifice electrode (orifice plate) 41 is used as a neutralization device for neutralizing an ion beam to generate a neutral particle beam. As shown in FIG. 3, the orifice electrode 41 has a number of orifices 41a defined therein. Ions accelerated by the grid electrode 4 are introduced into the orifices 41a defined in the orifice electrode 41. Most of the ions that pass through the orifices 41a in the orifice electrode 41 are neutralized by exchanging electrons with the sidewall surfaces of the orifices 41a, or by charge exchange with gas molecules remaining within the orifices 41a. Thus, the ions are converted into neutral particles.

The ions that have been neutralized when passing through the orifices 41a, i.e., the neutral particles, are then emitted as an energetic beam into the process chamber 6. The neutral particle beam travels directly in the process chamber 6 and is applied to the workpiece X placed on the workpiece holder 20, for thereby etching the surface of the workpiece X, cleaning the surface of the workpiece X, modifying (e.g., nitriding or oxidizing) the surface of the workpiece X, or depositing a film on the workpiece X.

In the example shown in FIG. 3, the orifice electrode (orifice plate) is used as a neutralization device for neutralizing ions. However, the neutralization device is not limited to the illustrated example. The present invention is also applicable to various neutralization devices, e.g., neutralization devices shown in FIGS. 5A through 5D.

In an example shown in FIG. 5A, a light source is disposed outside of the vacuum chamber 1 for applying light rays 42 to the ion beam. In the neutralizing chamber 5, electrons are detached from ions, particularly negative ions, by energy of the light rays 42, and hence the negative ions are neutralized.

In an example shown in FIG. 5B, a pair of electrodes 43a, 43b is provided in the vacuum chamber 1. One of the electrodes is connected to a high-frequency power supply 44, which applies a high-frequency electric field to the ion beam which is passing between the electrodes 43a, 43b. The negative ions of the ion beam are neutralized by the high-frequency electric field in the neutralizing chamber 5.

As shown in FIG. 5C, the neutralization device may comprise an electron beam radiation device for radiating electron beams 45 into a neutralizing chamber 5 through a window 46 provided in the vacuum chamber 1. Alternatively, the neutralization device may comprise an electron cloud generator for generating an electron cloud along a path of an ion beam.

Further, as shown in FIG. 5D, the neutralization device may comprise a gas inlet port 47 provided in the vacuum chamber 1 for introducing a process gas or the like into the vacuum chamber 1. In FIG. 5D, a region where the pressure of gas molecules is high is formed within a path of an ion beam, for thereby detaching electrons from ions, particularly negative ions, to neutralize the ions.

Operation of the neutral particle beam processing 5 apparatus according to the present embodiment will be described below.

The vacuum pump 23 is driven to evacuate the vacuum chamber 1. After the vacuum chamber 1 reaches a predetermined degree of vacuum, a gas such as $SF_6$, $CHF_3$, $CF_4$, $Cl_2$, Ar, $O_2$, $N_2$, or $C_4F_8$ is introduced from the gas supply source 13 into the plasma generating chamber 2. A high-frequency voltage having a frequency of about 13.56 MHz is applied to the coil 10 by the high-frequency power supply 101, so that a high-frequency electric field is produced in the plasma generating chamber 2. The gas introduced into the plasma generating chamber 2 is ionized by electrons that are accelerated by the high-frequency electric field, for thereby generating a high-density plasma in the plasma generating chamber 2. The plasma is mainly composed of positive ions and heated electrons.

The generated plasma which is mainly composed of positive ions and heated electrons is delivered to the adjacent negative ion generating chamber 3. In the negative ion generating chamber 3, electrons having a lowered electron temperature are attached to the residual gas, for thereby generating negative ions. Thus, negative ions can efficiently and continuously be generated from a plasma composed of electrons which have lost energy by collision while being delivered form the upstream side and have a lowered electron temperature, positive ions, and the residual gas. While ordinary plasmas are mostly composed of positive ions and electrons, the neutral particle beam processing apparatus according to the present embodiment can efficiently generate a plasma in which positive ions and negative ions coexist therein.

The ion extracting portion (grid electrode 4) for extracting positive or negative ions and accelerating the positive or negative ions in a predetermined direction is provided downstream of the negative ion generating chamber 3. A positive or negative bias voltage is applied to the grid electrode 4 by the power supply 8. When an AC voltage is applied to the grid electrode 4, positive ions and negative ions are alternately extracted from the negative ion generating chamber 3, then accelerated and emitted toward the workpiece X. Specifically, by properly adjusting the polarity, magnitude, and frequency of the accelerating voltage, positive and negative ions of desired energy levels are selectively or alternately extracted and applied to the workpiece X.

The neutralization device (neutralizing chamber 5) for neutralizing ions to generate a neutral particle beam is provided downstream of the ion extracting portion (grid electrode 4). In the neutralizing chamber 5, the positive ions are neutralized by attachment of electrons in the plasma, by charge exchange with the residual gas, or by charge exchange with negative ions, and converted into neutral particles. The negative ions are neutralized by detaching electrons in electron impact, by charge exchange with the residual gas, or by charge exchange with positive ions, and converted into neutral particles. Particularly, electrons are detached from the negative ions by a radiation (h v), an electron beam radiation, or application of a high-frequency electric field, and the negative ions are converted into neutral particles.

The negative ions or the positive ions that have been neutralized, i.e., the neutral particles, are emitted as an energetic beam into the process chamber 6. The neutral particles travel directly in the process chamber 6 and are applied to the workpiece X placed on the workpiece holder 20, for thereby etching the surface of the workpiece X, cleaning the surface of the workpiece X, modifying (e.g., nitriding or oxidizing) the surface of the workpiece X, or depositing a film on the workpiece X. Particularly, since these neutral particles can be generated from positive ions and negative ions at desired energy levels, the workpiece X can be processed flexibly.

As well known in the art, when an insulated workpiece such as a workpiece made of glass or ceramics is processed, charge build-up may be developed on the surface of the insulated workpiece. However, by applying neutralized particles to the insulating workpiece as described above, various processes including an etching process and a deposition process can be performed on the insulating workpiece with high accuracy in such a state that an amount of charge build-up is reduced. Various types of gases may be introduced into the plasma generating chamber 2 according to the type of process to be performed on the workpiece X. For example, in a dry etching process, oxygen or a halogen gas may selectively be used according to the kind of the workpiece X.

In the present embodiment, it is desirable to introduce a gas that is liable to generate negative ions, such as $O_2$, $Cl_2$, $SF_6$, $CHF_3$, or $C_4F_8$, into the plasma generating chamber 2 so as to apply neutral particles generated from the negative ions in the plasma. When the application of the high-frequency voltage is interrupted after a high-density plasma is generated by the aforementioned high-frequency inductive coupling (ICP) with use of the above gas, a large number of negative ions can be generated and a neutral particle beam can be generated from the generated negative ions.

In the present embodiment, the plasma is generated with use of a coil for ICP. However, the plasma may be generated with use of an electron cyclotron resonance source (ECR source), a coil for helicon wave plasma, a microwave, or the like. The frequency of the high-frequency voltage is not limited to 13.56 MHz, but may be in the range from 1 MHz to 20 GHz.

In the above embodiment, the positive and negative ions extracted from the negative ion generating chamber by the ion extracting portion are neutralized and converted into neutral particles, and the neutral particles are applied as a neutral particle beam to the workpiece. However, the positive and negative ions may directly be applied to the workpiece without the neutralization device (neutralizing chamber).

Although certain preferred embodiments of the present invention have been shown and described in detail, it should be understood that various changes and modifications may be made therein without departing from the scope of the appended claims.

INDUSTRIAL APPLICABILITY

The present invention is suitable for use in a neutral particle beam processing apparatus for generating a highly directional and highly dense neutral particle beam from a high-density plasma and processing a workpiece with the generated neutral particle beam.

What is claimed is:

1. A neutral particle beam processing apparatus, comprising:
   a process gas inlet port for introducing a process gas into a vacuum chamber;
   a plasma generating chamber for generating positive ions and electrons from the introduced process gas by inductively coupled plasma;
   a negative ion generating chamber for attaching said electrons generated in said plasma generating chamber to the residual gas to generate negative ions;
   an ion extracting portion for extracting said positive ions or said negative ions and accelerating said positive ions or said negative ions in a predetermined direction; and
   a neutralization device for neutralizing an ion beam generated by said ion extracting portion to generate a neutral particle beam, said neutral particle beam being applied to a workpiece.

2. A neutral particle beam processing apparatus according to claim 1, wherein said ion extracting portion comprises a grid electrode and a power supply for biasing said grid electrode to a positive or negative potential.

3. A neutral particle beam processing apparatus according to claim 1, wherein said neutralization device comprises a light source for applying a light ray to said ion beam.

4. A neutral particle beam processing apparatus according to claim 1, wherein said neutralization device comprises an electrode and a power supply for applying a high-frequency electric field through said electrode to said ion beam.

5. A neutral particle beam processing apparatus according to claim 1, wherein said neutralization device comprises an electron beam radiation device for radiating an electron beam to said ion beam.

6. A neutral particle beam processing apparatus according to claim 1, wherein said neutralization device forms a region where the pressure of gas molecules is high within a path of said ion beam.

7. A neutral particle beam processing apparatus according to claim 1, wherein said neutralization device comprises an orifice plate having orifices for allowing said ion beam to pass therethrough.

8. A neutral particle beam processing apparatus comprising:
   a process gas inlet port for introducing a process gas into a vacuum chamber;
   a plasma generating chamber for generating positive ions and electrons from the introduced process gas;
   a negative ion generating chamber for attaching said electrons generated in said plasma generating chamber to the residual gas to generate negative ions;
   an ion extracting portion for extracting said positive ions or said negative ions and accelerating said positive ions or said negative ions in a predetermined direction;
   a neutralization device for neutralizing an ion beam generated by said ion extracting portion to generate a neutral particle beam, said neutral particle beam being applied to a workpiece; and
   an electron cloud generator provided in said negative ion generating chamber for lowering the probability that said electrons collide with a sidewall surface of said negative ion generating chamber and are inactivated and for increasing the probability that said electrons attach to said residual gas.

9. A neutral particle beam processing apparatus comprising:
   a process gas inlet port for introducing a process gas into a vacuum chamber;
   a plasma generating chamber for generating positive ions and electrons from the introduced process gas;
   a negative ion generating chamber for attaching said electrons generated in said plasma generating chamber to the residual gas to generate negative ions;
   an ion extracting portion for extracting said positive ions or said negative ions and accelerating said positive ions or said negative ions in a predetermined direction; and
   a neutralization device for neutralizing an ion beam generated by said ion extracting portion to generate a neutral particle beam, said neutral particle beam being applied to a workpiece,
   wherein said neutralization device comprises an electron cloud generator for generating an electron cloud along a path of said ion beam.

10. A neutral particle beam processing apparatus, comprising:
    a process gas inlet port for introducing a process gas into a vacuum chamber;
    a plasma generating chamber for generating positive ions and electrons from the introduced process gas;
    a negative ion generating chamber for attaching said electrons generated in said plasma generating chamber to the residual gas to generate negative ions;
    an ion extracting portion for alternately extracting said positive ions and said negative ions and alternately accelerating said positive ions and said negative ions in a predetermined direction; and
    a neutralization device for neutralizing an ion beam generated by said ion extracting portion to generate a neutral particle beam, said neutral particle beam being applied to a workpiece,
    wherein said ion extracting portion comprises a grid electrode and a power supply for applying an AC voltage to said grid electrode to bias said grid electrode to a positive or negative potential.

11. A neutral particle beam processing apparatus according to claim 10, further comprising an electron cloud generator provided in said negative ion generating chamber for lowering the probability that said electrons collide with a sidewall surface of said negative ion generating chamber and are inactivated and for increasing the probability that said electrons attach to said residual gas.

12. A neutral particle beam processing apparatus according to claim 10, wherein said neutralization device comprises a light source for applying a light ray to said ion beam.

13. A neutral particle beam processing apparatus according to claim 10, wherein said neutralization device comprises an electrode and a power supply for applying a high-frequency electric field through said electrode to said ion beam.

14. A neutral particle beam processing apparatus according to claim 10, wherein said neutralization device comprises an electron beam radiation device for radiating an electron beam to said ion beam.

15. A neutral particle beam processing apparatus according to claim 10, wherein said neutralization device comprises an electron cloud generator for generating an electron cloud along a path of said ion beam.

16. A neutral particle beam processing apparatus according to claim 10, wherein said neutralization device forms a region where the pressure of gas molecules is high within a path of said ion beam.

17. A neutral particle beam processing apparatus according to claim 10, wherein said neutralization device comprises an orifice plate having orifices for allowing said ion beam to pass therethrough.

* * * * *